United States Patent
Yen et al.

(10) Patent No.: US 9,397,705 B2
(45) Date of Patent: Jul. 19, 2016

(54) DECODER FOR LDPC CODE AND BCH CODE AND DECODING METHOD THEREOF

(71) Applicant: STORART TECHNOLOGY CO., LTD., Hsinchu (TW)

(72) Inventors: Chih-Nan Yen, Hsinchu (TW); Jui-Hui Hung, Tainan (TW)

(73) Assignee: STORART TECHNOLOGY CO., LTD., Hsinchu (TW)

( * ) Notice: Subject to any disclaimer, the term of this patent is extended or adjusted under 35 U.S.C. 154(b) by 111 days.

(21) Appl. No.: 14/269,101

(22) Filed: May 3, 2014

(65) Prior Publication Data
US 2015/0188574 A1 Jul. 2, 2015

(30) Foreign Application Priority Data

Dec. 30, 2013 (TW) .............................. 102149112 A (51) Int. Cl.
| | | |
|---|---|---|
| *H03M 13/29* | (2006.01) | |
| *H03M 13/37* | (2006.01) | |
| *H03M 13/15* | (2006.01) | |
| *H03M 13/11* | (2006.01) | |

(52) U.S. Cl.
CPC ...... *H03M 13/2906* (2013.01); *H03M 13/2927* (2013.01); *H03M 13/2948* (2013.01); *H03M 13/3738* (2013.01); *H03M 13/1102* (2013.01); *H03M 13/152* (2013.01)

(58) Field of Classification Search
CPC .......... H03M 13/2906; H03M 13/152; H03M 13/15; H03M 13/1535; H03M 13/1154; H03M 13/1174; H03M 13/1177
USPC ....................................................... 714/782
See application file for complete search history.

(56) References Cited

U.S. PATENT DOCUMENTS

| | | | | |
|---|---|---|---|---|
| 7,191,378 B2 | 3/2007 | Eroz et al. | | |
| 8,065,598 B1* | 11/2011 | Gunnam | ............. | H03M 13/116 714/800 |
| 8,375,268 B2* | 2/2013 | Shinya | ............. | H03M 13/2906 714/755 |
| 8,583,981 B2* | 11/2013 | Varnica | ............... | G06F 11/1008 714/746 |
| 2010/0077276 A1* | 3/2010 | Okamura | .......... | H03M 13/1102 714/752 |
| 2013/0145229 A1 | 6/2013 | Frayer et al. | | |
| 2013/0227378 A1* | 8/2013 | Yamamoto | .......... | H03M 13/033 714/776 |
| 2015/0046765 A1* | 2/2015 | Shinohara | ......... | H03M 13/1177 714/752 |

OTHER PUBLICATIONS

Yi-Min Lin; Jau-Yet Wu; Chien-Ching Lin; Chang, Hsie-Chia, "A long block length bch decoder for DVB-S2 application," in Integrated Circuits, ISIC '09. Proceedings of the 2009 12th International Symposium on , vol., No., pp. 171-174, Dec. 14-16, 2009.*

(Continued)

*Primary Examiner* — Cynthia Britt
(74) *Attorney, Agent, or Firm* — Li & Cai Intellectual Property (USA) Office (57) ABSTRACT

A decoder for A LDPC code and A BCH code and decoding method thereof are provided. The decoder decodes the encoded data based on the LDPC code and decodes the encoded data based on the BCH code simultaneously. Then the decoder outputs decoded data after the decoding procedure has been finished. Additionally, in the decoding procedure for decoding the encoded data based on the BCH code, the decoded result which the encoded data is decoded based on the LDPC code is utilized, so as to increase the processing speed for decoding the encoded data, and enhance the overall decoding performance.

17 Claims, 7 Drawing Sheets

(56) References Cited

OTHER PUBLICATIONS

Yung-Yih Jian; Pfister, H.D.; Narayanan, K.R.; Rao, R.; Mazahreh, R., "Iterative hard-decision decoding of braided BCH codes for high-speed optical communication," in Global Communications Conference (GLOBECOM), 2013 IEEE , vol., No., pp. 2376-2381, Dec. 9-13, 2013.*

* cited by examiner

DECODER FOR LDPC CODE AND BCH CODE AND DECODING METHOD THEREOF

BACKGROUND

1. Technical Field

The present disclosure relates to a decoder and a decoding method thereof, in particular, to a decoder for a LDPC code and a BCH code and a decoding method thereof.

2. Description of Related Art

During data transmission, data may be lost or damaged due to the poor reliability of the transmission medium or external interferences. Error correcting code or error control code has been designed for correcting the damage or loss data and the reconstruction of the raw data. Common error correcting codes include Hamming Code, Reed Solomon Code, Bose Chaudhuri Hocquenghem (BCH) Code, and Low Density Parity Check (LDPC) Code, wherein the LDPC code has the best error correcting performance, but the computational complexity thereof is relatively high.

Figure 1A:
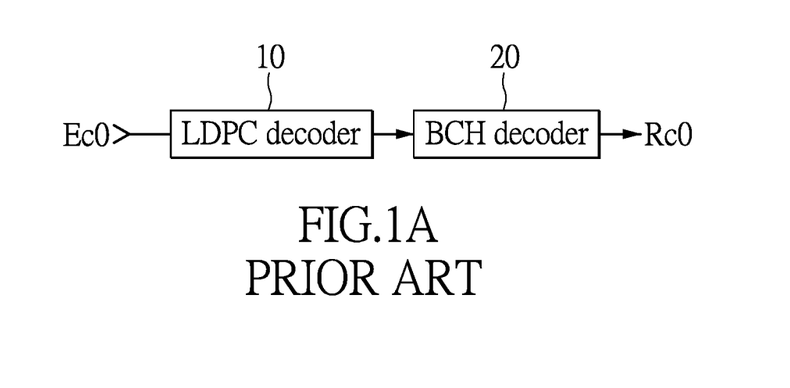
FIG. 1A shows a diagram of the conventional configuration of a LDPC decoder connecting to a BCH decoder in series.

In order to simultaneously have better error correcting ability and the low computational complexity, a LDPC decoder generally is designed to adopt the Min-Sum algorithm and connected with a BCH decoder in series for executing the decoding algorithm. As shown in FIG. 1A, the encoded data Ec0 is firstly decoded by the LDPC decoder 10 based on the Min-Sum algorithm, and the decoded data is then inputted to the BCH decoder 20 to generate the decoded result Rc0. Even though using the LDPC decoder 10 with the Min-Sum algorithm can greatly reduce the computational complexity, the efficiency at same time may be slightly reduced. The BCH decoder 20 can ensure that the erroneous data can be corrected while the number of batches associated with erroneous information in the data is under a predefined number.

Figure 1B:
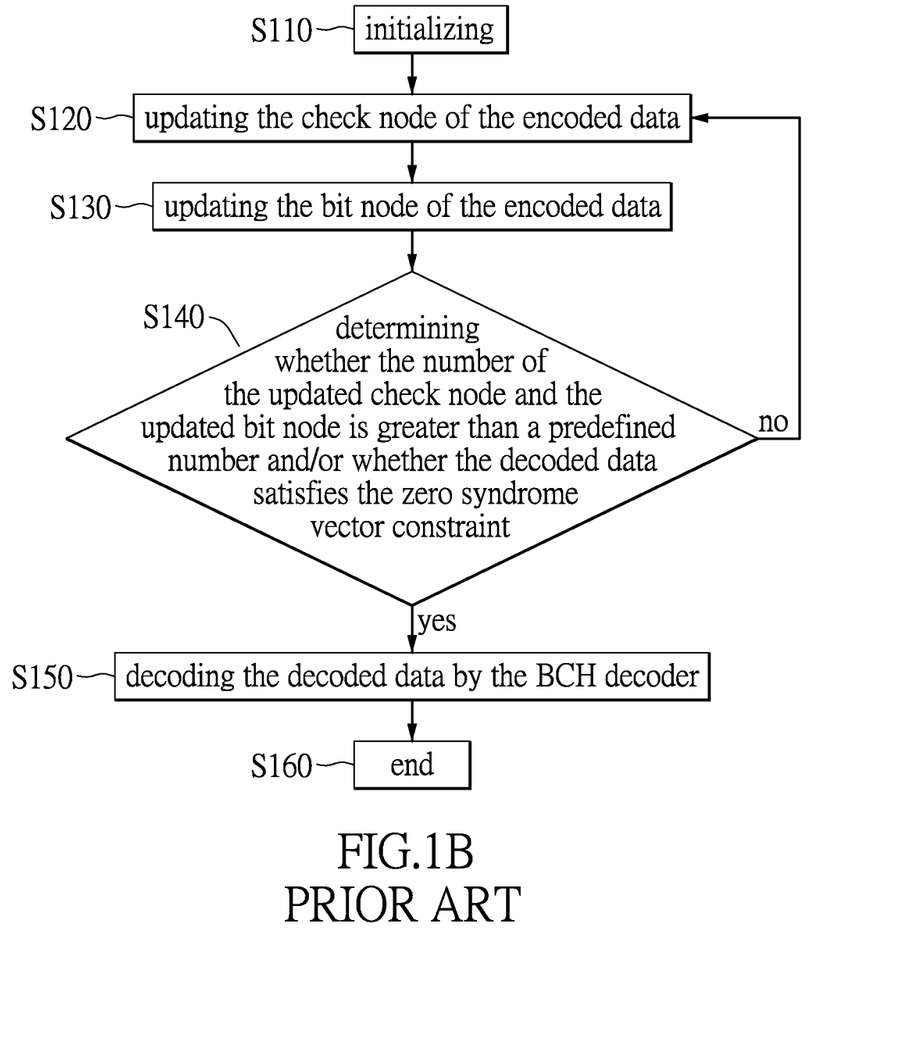
FIG. 1B shows a flowchart of the conventional decoding method of the LDPC decoder connecting to the BCH decoder in series.

The following description describes a decoding method for a LDPC decoder connected to the BCH decoder in series, as shown in FIG. 1B. At Step S110, the LDPC decoder and the BCH decoder are firstly initialized. Then the check node and the bit node of the encoded data are respectively updated at Steps S120 and S130. Afterwards, whether the number of the updated check node and the updated bit node is greater than a predefined number and/or whether the decoded data satisfies the zero syndrome vector constraint (i.e., $Hx^T=0$, where x denotes the decoded codeword in row vector form, and H denotes a syndrome check matrix) are determined at Step S140. At Step S150, when that the number of the updated check node and the updated bit node is greater than the predefined number and the decoded data satisfies the zero syndrome vector constraint is determined, the BCH decoder starts to decode the decoded data to ensure accuracy of the decoded data. At Step S160, the result of the decoded data is outputted. By contrast, if the determination at Step S140 is false, the decoding method goes back to Step S120 for updating the check node and the bit node again.

Though the conventional structure which the LDPC decoder is connected to the BCH decoder in series is capable of reducing the computational complexity while ensuring the error correcting ability, the entire decoding time is considerable long since the encoded data Ec0 must be firstly decoded by the LDPC decoder, and then the BCH decoder decodes the decoded data from the LDPC decoder to generate the decoded result Rc0. Thus, within the same decoding time, the processing amount for decoding in the above decoder is decreased, and the overall decoding performance may be poor.

SUMMARY

An exemplary embodiment of the present disclosure provides a decoder for a LDPC code and a BCH code and a decoding method thereof. The decoder decodes an encoded data based on the LDPC code and decodes the encoded data based on the BCH code simultaneously, and outputs a decoded data after finishing the decoding procedure. Accordingly, in the same decoding time, the processing amount for decoding in the decoder of the present disclosure may be increased, and the overall decoding performance of the decoder is enhanced.

According to one exemplary embodiment of the present disclosure, a decoding method for a LDPC code and a BCH code is provided. The decoding method is used to decode an encoded data with a bit node and a check node. The decoding method includes the following steps. Firstly, the bit node of the encoded data is initialized after the encoded data is received. Then, the encoded data is decoded based on the LDPC code to generate a LDPC decoded data and updating the encoded data to be the LDPC decoded data to generate an updated encoded data. Afterwards, the encoded data is decoded based on the BCH code to generate a BCH syndrome test data and a BCH decoded data, wherein the BCH syndrome test data is used to determine whether the BCH decoded data satisfies a null vector requirement. When the BCH syndrome test data indicates that the BCH decoded data fails to satisfy the null vector requirement, the updated encoded data is decoded based on the BCH code to generate a next BCH syndrome test data and a next BCH decoded data.

According to one exemplary embodiment of the present disclosure, a decoder for a LDPC code and a BCH code is provided. The decoder is configured to decode an encoded data with a bit node and a check node. The decoder includes a receiving unit, a LDPC decoder, a BCH decoder, and a determination unit. The receiving unit operatively initializes the bit node of the encoded data after the encoded data is received. The LDPC decoder is coupled to the receiving unit and operatively decodes the encoded data based on the LDPC code to generate a LDPC decoded data, wherein the LDPC decoder outputs the LDPC decoded data to the receiving unit to update the encoded data to be the LDPC decoded data to generate an updated encoded data. The BCH decoder is coupled to the receiving unit and operatively decodes the encoded data based on the BCH code and generates a BCH syndrome test data and a BCH decoded data, wherein the BCH syndrome test data is used to determine whether the BCH decoded data satisfies a null vector requirement. The determination unit is coupled to the BCH decoder. When the determination unit receives the BCH decoded data that satisfies the null vector requirement, the determination unit outputs a decoded result indicating that the encoded data has been successfully decoded and the BCH decoded data. When the determination unit receives the BCH decoded data that fails to satisfy the null vector requirement, the determination unit outputs an operation signal to the BCH decoder to drive the BCH decoder to decode the updated encoded data based on the BCH code and generate a next BCH syndrome test data and a next BCH decoded data.

To sum up, the present disclosure provides a decoder for a LDPC code and a BCH code and a decoding method thereof, which can decode the encoded data based on the LDPC code and decode the encoded data based on the BCH code simultaneously, and outputs the decoded data after the decoding procedure has been finished. Additionally, in the decoding procedure for decoding the encoded data based on the BCH code, the result which the encoded data is decoded based on the LDPC code is utilized, so as to increase the speed for decoding the encoded data, and enhance the overall decoding performance.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
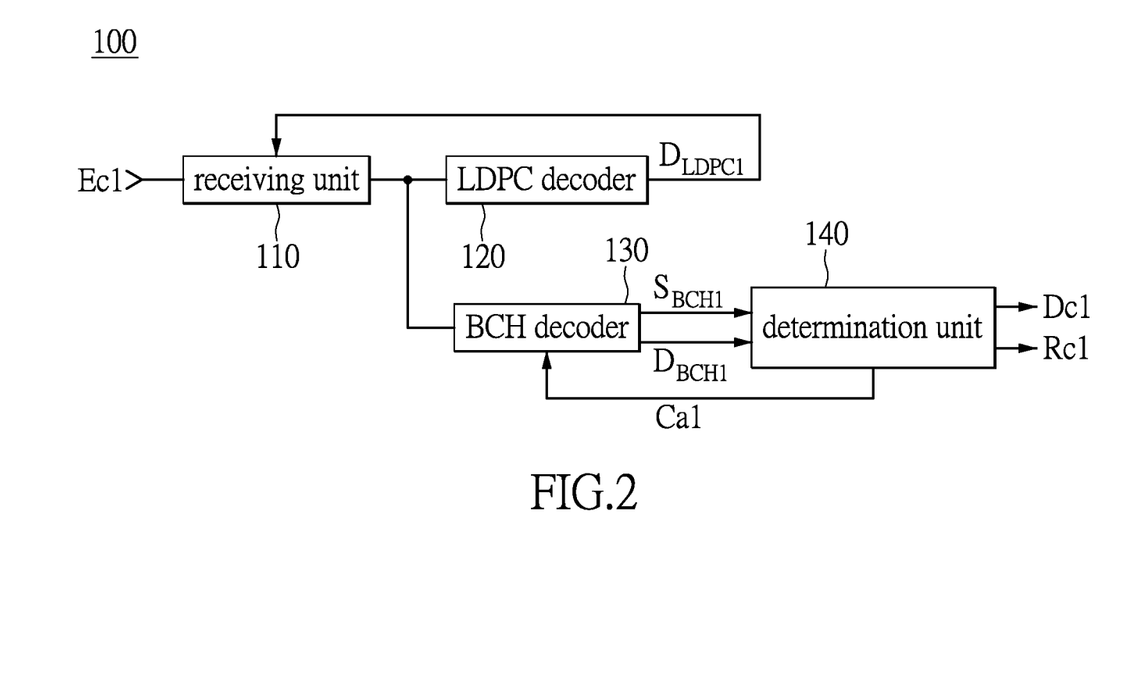
FIG. 2 shows a diagram of a decoder for a LDPC code and a BCH code provided according to an exemplary embodiment of the present disclosure.

As shown in FIG. 2, FIG. 2 describes a diagram of a decoder for a LDPC code and a BCH code provided according to an exemplary embodiment of the present disclosure. As shown In FIG. 2, the decoder 100 for a LDPC code and a BCH code is used to decode an encoded data Ec1 with a bit node and a check node to generate a decoded data Dc1 and ensure the accuracy of the decoded data Dc1. The encoded data Ec1 is formed from a raw data (not shown in the drawings) through an encoder. Moreover, the person with ordinary skill in the art shall know the bit node and the check node in the error correcting code, and further descriptions are hereby omitted.

The decoder 100 includes a receiving unit 110, a LDPC decoder 120, a BCH decoder 130, and a determination unit 140. The receiving unit 110 receives the encoded data Ec1 and initializes the bit node of the encoded data Ec1. In the present disclosure, the receiving unit 110 initializes the bit node of the encoded data Ec1 based on the log likelihood ration (LLR), such that the encoded data Ec1 can meet the algorithmic model of the LDPC decoder 120 and the BCH decoder 130. Therefore, the encoded data Ec1 can be processed in the LDPC decoder 120 and the BCH decoder 130. The receiving unit 100 can also initialize the bit node of the encoded data Ec1 by other methods (e.g., normalization or the like), and the present disclosure is not limited thereto.

The LDPC decoder 120 is coupled to the receiving unit 110. Based on the LDPC code, the LDPC decoder 120 decodes the encoded data Ec1 which has been initialized to generate a LDPC decoded data $D_{LDPC1}$. At the present, the accuracy of the LDPC decoded data $D_{LDPC1}$ is not ensured. The LDPC decoder 120 therefore transmits the LDPC decoded data $D_{LDPC1}$ to the receiving unit 110, and the receiving unit 110 updates the encoded data Ec1 to be the LDPC decoded data $D_{LDPC1}$ to generate the updated encoded data Ec1 to the BCH decoder 130, such that the BCH decoder 130 can decode the updated encoded data Ec1 to generate the decoded data DC 1 accurately.

The BCH decoder 130 is coupled between the receiving unit 110 and the LDPC decoder 120. The BCH decoder 130 decodes the encoded data Ec1 based on the BCH code to generate a BCH syndrome test data $S_{BCH1}$ and a BCH decoded data $D_{BCH1}$. The BCH syndrome test data $S_{BCH1}$ is used to determine whether the BCH decoded data $D_{BCH1}$ satisfies a null vector requirement.

In the present disclosure, the BCH syndrome test data $S_{BCH1}$ is a codeword syndrome test. Therefore, during the decoding procedure of the BCH decoder 130 for decoding the encoded data Ec1, when the BCH decoded data $D_{BCH1}$ satisfies the null vector requirement, it means that the BCH decoded data $D_{BCH1}$ is the correct data. Moreover, the BCH syndrome test data $S_{BCH1}$ is "1" to indicate that the BCH decoded data $D_{BCH1}$ is the correct data. Conversely, when the BCH decoded data $D_{BCH1}$ fails to satisfy the null vector requirement, it means that the BCH decoded data $D_{BCH1}$ is the error data. Moreover, the BCH syndrome test data $S_{BCH1}$ is "0" to indicate that the BCH decoded data $D_{BCH1}$ is the error data. The person with ordinary skill in the art shall know the method of the syndrome test, and further descriptions are hereby omitted.

The determination unit 140 is coupled to the BCH decoder 130 and determines whether the BCH decoded data $D_{BCH1}$ satisfies the null vector requirement (e.g, the BCH decoded data $D_{BCH1}$ is "0" or "1") to output a decoded result Rc1 (e.g., the decoded result Rc1 is "0" or "1") and the decoded data Dc1.

When the determination unit 140 receives the BCH decoded data $D_{BCH1}$ that satisfy the null vector requirement (e.g., the BCH decoded data $D_{BCH1}$ is "1"), the determination unit 140 outputs the decoded result Rc1 indicating that the encoded data Ec1 (e.g., the decoded result Rc1 is "1") has been successfully decoded and outputs the BCH decoded data $D_{BCH1}$ as the decoded data Dc1 to inform the next-stage device (not shown in the drawings) that the encoded data Ec1 is recovered to the raw data.

When the determination unit 140 receives the BCH decoded data $D_{BCH1}$ not satisfy the null vector requirement (e.g., the BCH decoded data $D_{BCH1}$ is "0"), the determination unit 140 transmits an operation signal Ca1 to the BCH decoder 130, so that the BCH decoder 130 decodes the updated encoded data Ec1 based on the BCH code to generate the next BCH syndrome test data $S_{BCH1}$ and the next BCH decoded data $D_{BCH1}$. It means that the decoder 100 still decodes the encoded data Ec1 to recover to the raw data.

In addition, when the determination unit 140 determines that the number of times which the BCH decoded data $D_{BCH1}$ fails to satisfy the null vector requirement is greater than a predefined erroneous number (e.g., the predefined erroneous number is 5), the determination unit 140 outputs the decoded result Rc1 indicating that a failure has occurred for decoding the encoded data Ec1 (e.g., the decoded result Rc1 is "0") and the BCH decoded data $D_{BCH1}$ as the decoded data Dc1 to inform the next-stage device (not shown in the drawings) that the encoded data Ec1 cannot be recovered to the raw data because of the encoded data Ec1 is lost or damaged.

In the present disclosure, the BCH syndrome test data $S_{BCH1}$ is not limited to be "0" or "1" to indicate whether the BCH decoded data $D_{BCH1}$ satisfies the null vector requirement. The decoded result Rc1 is not limited to be "0" or "1" to indicate whether the encoded data Ec1 has been successfully decoded. They can be also presented in other representations, such as the signal "a" or "b", the probability (e.g., 90%), or the like. The present disclosure is not limited thereto.

The following descriptions further elaborate the decoding method of the decoder 100 for the LDPC code and the BCH code. For clarity, in the present disclosure, the BCH syndrome test data $S_{BCH1}$ is "1" to indicate that the BCH decoded data $D_{BCH1}$ satisfies the null vector requirement. The BCH syndrome test data $S_{BCH1}$ is "0" to indicate that the BCH decoded data $D_{BCH1}$ fails to satisfy the null vector requirement. The decoding result Rc1 is "1" to indicate that the encoded data Ec1 has been successfully decoded. The decoding result Rc1 is "0" to indicate that the failure has occurred for decoding the encoded data Ec1.

Figure 3:
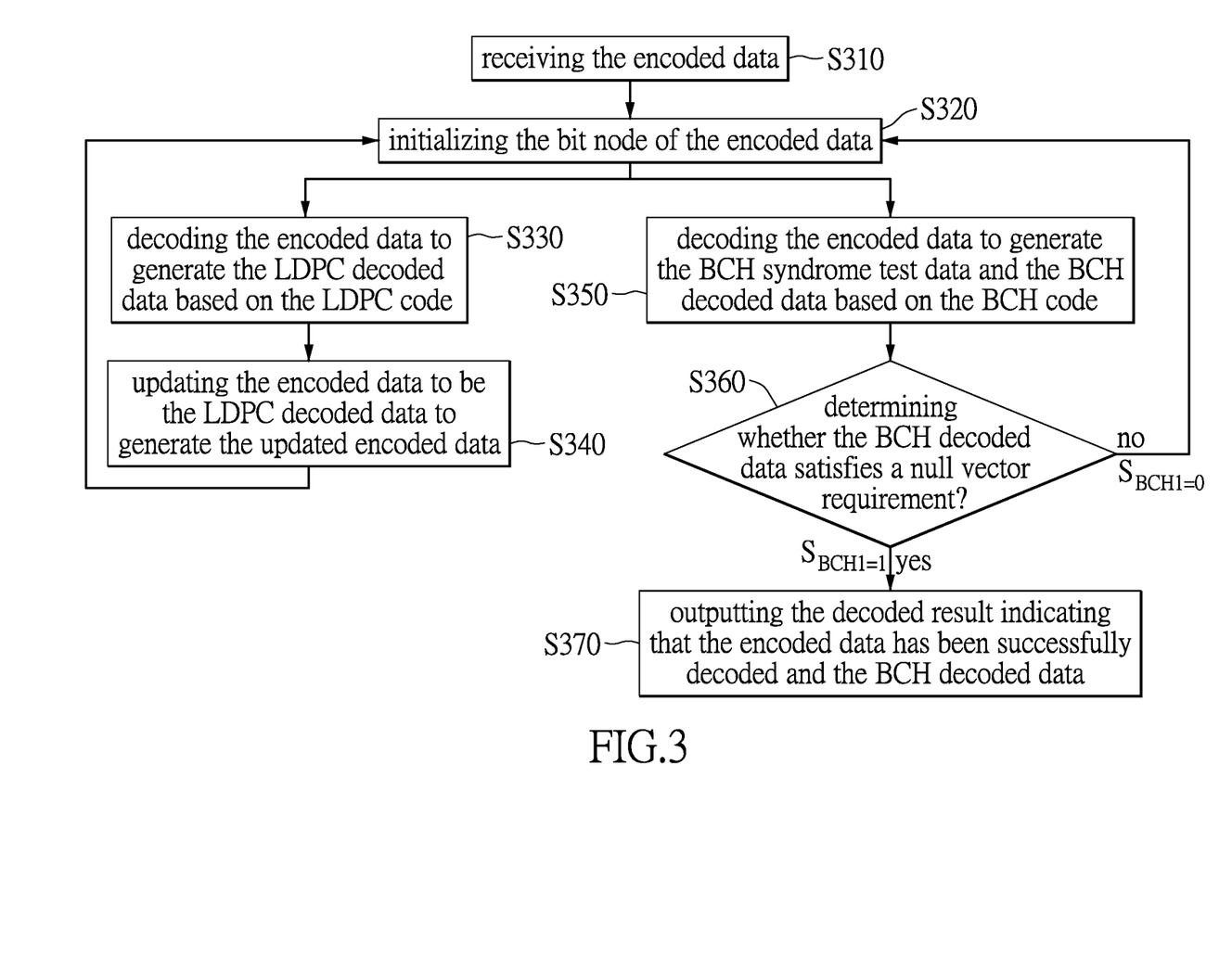
FIG. 3 shows a flowchart of a decoding method executed in the decoder of FIG. 2.

Please refer to FIG. 3 in conjunction with FIG. 2. Firstly, at Step S310, the receiving unit 110 receives the encoded data Ec1 for transmitting encoded data Ec1 to the LDPC decoder 120 and the BCH decoder 130. Next, at Step S320, the receiving unit 110 initializes the bit node of the encoded data Ec1, such that the encoded data Ec1 can meet the algorithmic model of the LDPC decoder 120 and the BCH decoder 130. Therefore, the encoded data Ec1 can be processed in the LDPC decoder 120 and the BCH decoder 130. Afterwards, the LDPC decoder 120 and the BCH decoder 130 of the decoder 100 decode the encoded data Ec1 simultaneously (i.e. Steps S330 and S350 are simultaneously begin to be executed). At Step S330, the LDPC decoder 120 decodes the encoded data Ec1 based on the LDPC code to generate the LDPC decoded data $D_{LDPC1}$. Next, the LDPC decoder 120 outputs the LDPC decoded data $D_{LDPC1}$ to the receiving unit 110. At Step S340, the receiving unit 110 updates the encoded data Ec1 to the LDPC decoded data $D_{LDPC1}$ to generate the updated encoded data Ec1. At Step S350, the BCH decoder 130 decodes the encoded data Ec1 based on the BCH code to generate the BCH syndrome test data $S_{BCH1}$ and the BCH decoded data $D_{BCH1}$.

Afterwards, at Step S360, the determination unit 140 determines whether the BCH decoded data $D_{BCH1}$ satisfies a null vector requirement (i.e., the BCH syndrome test data $S_{BCH1}$ is "1" or "0") and then accordingly determines whether to output the decoded result Rc1 and the decoded data Dc1. When the determination unit 140 determines that the BCH decoded data $D_{BCH1}$ satisfies the null vector requirement (i.e., the BCH syndrome test data $S_{BCH1}$ is "1"), at Step S370, the determination unit 140 outputs the decoded result Rc1 indicating that the encoded data Ec1 has been successfully decoded (i.e., the decoded result Rc1 is "1") and the BCH decoded data $D_{BCH1}$ is output as the decoded data Dc1. It means that the encoded data Ec1 is recovered to the raw data by the decoder 100.

Contrarily, when the determination unit 140 determines that the BCH decoded data $D_{BCH1}$ fails to satisfy the null vector requirement, the decoding method goes back to Step S320. At the present, the determination unit 140 transmits the operation signal Ca1 to the BCH decoder 130. Next, the BCH decoder 130 decodes the updated encoded data Ec1 based on the BCH code to generate the next BCH syndrome test data $S_{BCH1}$ and the next BCH decoded data $D_{BCH1}$, and the determination unit 140 proceeds the next determination. It means that the decoder 100 is trying to recover the encoded data Ec1 to the raw data at present.

Figure 4:
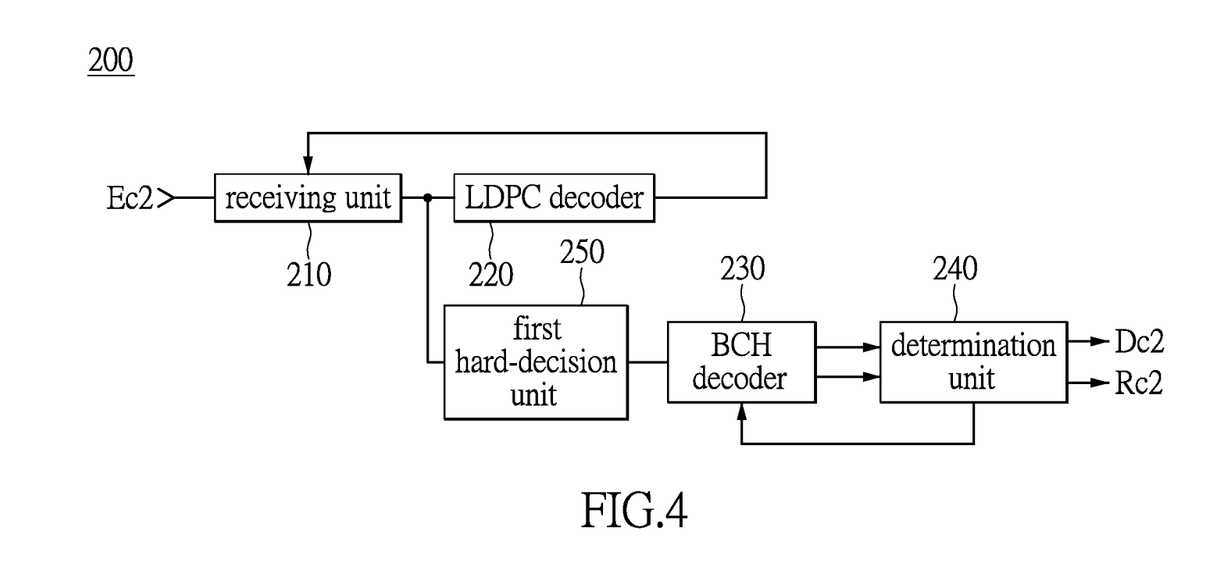
FIG. 4 shows a diagram of a decoder for a LDPC code and a BCH code provided according to another exemplary embodiment of the present disclosure.

Next, please refer to FIG. 4, which shows a diagram of a decoder for a LDPC code and a BCH code provided according to another exemplary embodiment of the present disclosure. The decoder 200 includes a receiving unit 210, a LDPC decoder 220, a BCH decoder 230, and a determination unit 240. The connective relationships and the operations of the receiving unit 210, the LDPC decoder 220, the BCH decoder 230, and the determination unit 240 of decoder 200 are same as those of the receiving unit 110, the LDPC decoder 120, the BCH decoder 130, and the determination unit 140 of decoder 100, and further descriptions are hereby omitted.

It is worth to note that the decoder 200 further includes a first hard-decision unit 250. The first hard-decision unit 250 is coupled between the receiving unit 210 and the BCH decoder 230. The first hard-decision unit 250 performs a hard decision on the encoded data Ec2. In the present disclosure, the first hard-decision unit 250 indicates the hard decision of error correction code, such that the hard decision result of the encoded data Ec2 is represented by a combination of a plurality of "0" and "1" and output to the BCH decoder 230. Therefore, the BCH decoder 230 decodes the encoded data Ec2 after the hard decision process has been executed. Then the determination unit 240 generates the decoded result Rc2 and the decoded data Dc2.

Figure 5:
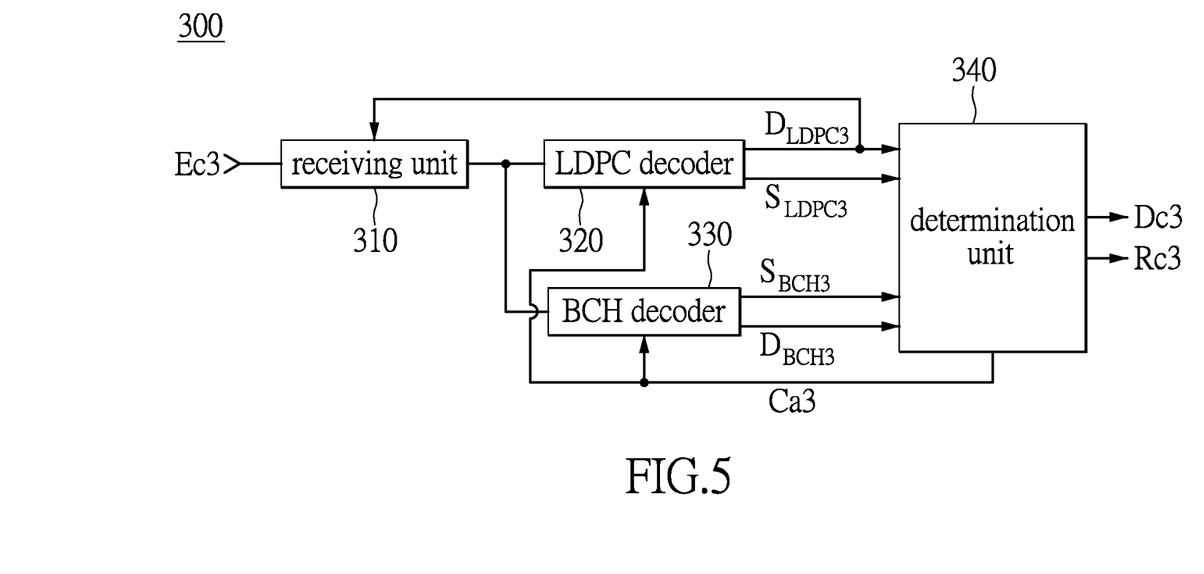
FIG. 5 shows a diagram of a decoder for a LDPC code and a BCH code provided according to another exemplary embodiment of the present disclosure.

Next, please refer to FIG. 5, which shows a diagram of a decoder for a LDPC code and a BCH code provided according to another exemplary embodiment of the present disclosure. The decoder 300 includes a receiving unit 310, a LDPC decoder 320, a BCH decoder 330, and a determination unit 340. Comparing the LDPC decoder 120 with the LDPC decoder 320, the LDPC decoder 120 decodes the initialized encoded data Ec3 based on the LDPC code to generate the LDPC syndrome test data $S_{LDPC3}$ and the LDPC decoded data $D_{LDPC3}$.

The LDPC syndrome test data $S_{LDPC3}$ is used to determine that the LDPC decoded data $D_{LDPC3}$ satisfies the null vector requirement. In the present disclosure, the LDPC syndrome test data $S_{LDPC3}$ is a codeword syndrome test. Therefore, during the decoding procedure of the LDPC decoder 320 decoding the encoded data Ec3, when the LDPC decoded data $D_{LDPC3}$ satisfies the null vector requirement, it means that the LDPC decoded data $D_{LDPC3}$ is the correct data. Moreover, the LDPC syndrome test data $S_{LDPC3}$ is "1" to indicate that the LDPC decoded data $D_{LDPC3}$ is the correct data. Conversely, when the LDPC decoded data $D_{LDPC3}$ fails to satisfy the null vector requirement, it means that the LDPC decoded data $D_{LDPC3}$ is the error data. The person with ordinary skill in the art shall know the method of the syndrome test, and further descriptions are hereby omitted.

In addition, comparing the determination unit 140 with the determination unit 340, the determination unit 140 is coupled to the BCH decoder 130 and determines whether the BCH decoded data $D_{BCH1}$ satisfies the null vector requirement to output the decoded result Rc1 and the decoded data Dc1; however, in the exemplary embodiment, the determination unit 340 is coupled to the LDPC decoder 320 and the BCH decoder 330 and determines whether the BCH decoded data $D_{BCH3}$ satisfies the null vector requirement (i.e., the BCH syndrome test data $S_{BCH3}$ is "1" or "0") and whether the LDPC decoded data $D_{LDPC3}$ satisfies the null vector requirement (i.e., the LDPC syndrome test data $S_{LDPC3}$ is "1" or "0") to output the decoded result Rc3 and decoded data Dc3.

When the determination unit 340 determines that the BCH decoded data $D_{BCH3}$ satisfies the null vector requirement (i.e., the BCH syndrome test data $S_{BCH3}$ is "1") and the LDPC decoded data satisfies the null vector requirement (i.e., the LDPC syndrome test data $S_{LDPC3}$ is "1"), the determination unit 340 outputs the decoded result Rc3 indicating that the encoded data Ec3 has been decoded successfully (i.e., the decoded result Rc3 is "1") and the LDPC decoded data $D_{LDPC3}$ as the decoded data Dc3 to inform the next-stage device (not shown in the drawings) that the encoded data Ec3 is recovered to the raw data.

When the determination unit 340 determines that the BCH decoded data $D_{BCH3}$ fails to satisfy the null vector requirement (i.e., the BCH syndrome test data $S_{BCH3}$ is "0") and the LDPC decoded data satisfies the null vector requirement (i.e., the LDPC syndrome test data $S_{LDPC3}$ is "1"), the determination unit 340 outputs the decoded result Rc3 indicating that the encoded data Ec3 has been decoded successfully (i.e., the decoded result Rc3 is "1") and the LDPC decoded data $D_{LDPC3}$ as the decoded data Dc3 to inform the next-stage device that the encoded data Ec3 is recovered to the raw data.

When the determination unit 340 determines that the BCH decoded data $D_{BCH3}$ satisfies the null vector requirement (i.e., the BCH syndrome test data $S_{BCH3}$ is "1") and the LDPC decoded data fails to satisfy the null vector requirement (i.e., the LDPC syndrome test data $S_{LDPC3}$ is "0"), the determination unit 340 outputs the decoded result Rc3 indicating that the encoded data Ec3 has been decoded successfully (i.e., the decoded result Rc3 is "1") and the BCH decoded data $D_{BCHC3}$ as the decoded data Dc3 to inform the next-stage device that the encoded data Ec3 is recovered to the raw data.

When the determination unit 340 determines that the BCH decoded data $D_{BCH3}$ fails to satisfy the null vector requirement (i.e., the BCH syndrome test data $S_{BCH3}$ is "0") and the LDPC decoded data fails to satisfy the null vector requirement (i.e., the LDPC syndrome test data $S_{LDPC3}$ is "0"), the determination unit 340 does not output the decoded result Rc3 and the decoded data Dc3. The determination unit 340 outputs the operation signal Ca3 to the BCH decoder 330 and the LDPC decoder 320. Thus, the BCH decoder 330 decodes the updated encoded data Ec3 based on the BCH code to generate the next BCH syndrome test data $S_{BCH3}$ and the next BCH decoded data $D_{BCH3}$, and the LDPC decoder 320 decodes the updated encoded data Ec3 based on the LDPC code to generate the next LDPC syndrome test data $S_{LDPC3}$ and the next LDPC decoded data $D_{LDPC3}$. It means that the decoder 300 still decodes the encoded data Ec3 to recover to the raw data.

When the determination unit 340 simultaneously determines that the number of times which the BCH decoded data $D_{BCH3}$ fails to satisfy the null vector requirement (i.e., the BCH syndrome test data is "0") and the LDPC decoded data $D_{LDPC3}$ fails to satisfy the null vector requirement (i.e., the LDPC syndrome test data is "0") is greater than a predefined erroneous number (e.g., the predefined erroneous number is 5), the determination unit 340 outputs the decoded result Rc3 indicating that a failure has occurred for decoding the encoded data Ec3 (i.e., the decoded result Rc3 is "0") and the BCH decoded data $D_{BCH3}$ as the decoded data Dc3 to inform the next stage device (not shown in the drawings) that the encoded data Ec3 cannot be recovered to the raw data because of the encoded data Ec3 is lost or damaged.

In the present disclosure, the BCH syndrome test data $S_{BCH3}$ is not limited to be "0" or "1" to indicate whether the BCH decoded data $D_{BCH3}$ satisfies the null vector requirement. The LDPC syndrome test data $S_{LDPC3}$ is not limited to be limit "0" or "1" to indicate whether the LDPC decoded data $D_{LDPC3}$ satisfies the null vector requirement. The decoded result Rc3 is not limited to "0" or "1" to indicate whether the encoded data Ec3 has been successfully decoded. They can be also presented in other representations, such as the signal "a" or "b", the probability (e.g., 90%), or the like. The present disclosure is not limited thereto.

The following descriptions further elaborate the decoding method of the decoder 300 for the LDPC code and the BCH code. For clarity, in the present disclosure, the BCH syndrome test data $S_{BCH3}$ is "1" to indicate that the BCH decoded data $D_{BCH3}$ satisfies the null vector requirement. The BCH syndrome test data $S_{BCH3}$ is "0" to indicate that the BCH decoded data $D_{BCH3}$ fails to satisfy the null vector requirement. The LDPC syndrome test data $S_{LDPC3}$ is "1" to indicate that the LDPC decoded data $D_{LDPC3}$ satisfies the null vector requirement. The LDPC syndrome test data $S_{LDPC3}$ is "0" to indicate that the LDPC decoded data $D_{LDPC3}$ fails to satisfy the null vector requirement. The decoding result Rc3 is "1" to indicate that the encoded data Ec3 has been successfully decoded. The decoding result Rc3 is "0" to indicate that the failure has occurred for decoding the encoded data Ec3.

Figure 6:
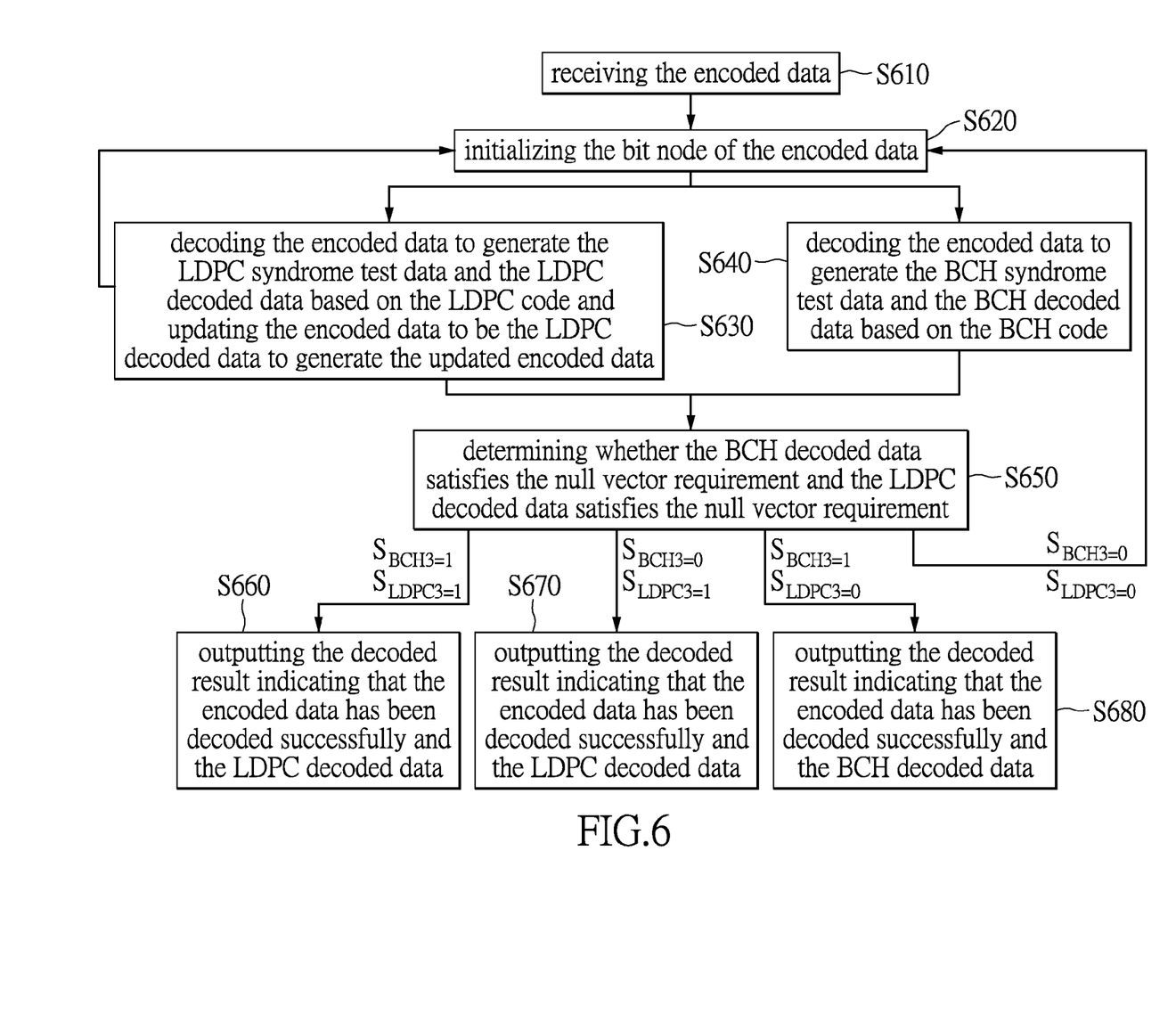
FIG. 6 shows a flowchart of a decoding method executed in the decoder of FIG. 5.

Please refer to FIG. 6 in conjunction with FIG. 5. Firstly, at Step S610, the receiving unit 310 receives the encoded data Ec3 for transmitting the encoded data Ec3 to the LDPC decoder 320 and the BCH decoder 33. Next, at Step S620, the receiving unit 310 initializes the bit node of the encoded data Ec3, such that the encoded data Ec3 meets the algorithmic model of the LDPC decoder 320 and the BCH decoder 330. Therefore, the encoded data Ec3 can be processed in the LDPC decoder 320 and the BCH decoder 330.

Next, the LDPC decoder 320 and the BCH decoder 330 of the decoder 300 decode the encoded data Ec3 simultaneously (i.e. Steps S630 and S640 are simultaneously begin to be executed). At Step S630, the LDPC decoder 320 decodes the encoded data Ec3 based on the LDPC code to generate the LDPC syndrome test data $S_{LDPC3}$ and the LDPC decoded data $D_{LDPC3}$, and then outputs the LDPC decoded data $D_{LDPC3}$ to the receiving unit 310, such that the receiving unit 310 can update the encoded data Ec3 to be the LDPC decoded data $D_{LDPC3}$ to generate the updated encoded data Ec3. At Step S640, the BCH decoder 330 decodes the encoded data Ec3 based on the BCH code to generate the BCH syndrome test data $S_{BCH3}$ and the BCH decoded data $D_{BCH3}$.

Afterwards, at Step S650. the determination unit 340 simultaneously determines whether the BCH decoded data $D_{BCH3}$ satisfies the null vector requirement (i.e., the BCH syndrome test data $S_{BCH3}$ is "1" or "0") and the LDPC decoded data $D_{LDPC3}$ satisfies the null vector requirement (i.e., the LDPC syndrome test data $S_{LDPC3}$ is "1" or "0") and then accordingly determines whether to output the decoded result Rc3 and the decoded data Dc3.

When the determination unit 340 determines that the BCH decoded data $D_{BCH3}$ satisfies the null vector requirement (i.e., the BCH syndrome test data $S_{BCH3}$ is "1") and the LDPC decoded data satisfies the null vector requirement (i.e., the LDPC syndrome test data $S_{LDPC3}$ is "1"), at Step S660, the determination unit 340 outputs the decoded result Rc3 indicating that the encoded data Ec3 has been decoded successfully (i.e., the decoded result Rc3 is "1") and the LDPC decoded data $D_{LDPC3}$ as the decoded data Dc3. It means that the encoded data Ec3 is recovered to the raw data by the decoder 300.

When the determination unit 340 determines that the BCH decoded data $D_{BCH3}$ fails to satisfy the null vector requirement (i.e., the BCH syndrome test data $S_{BCH3}$ is "0") and the LDPC decoded data satisfies the null vector requirement (i.e., the LDPC syndrome test data $S_{LDPC3}$ is "1"), at Step S670, the determination unit 340 outputs the decoded result Rc3 indicating that the encoded data Ec3 has been decoded successfully (i.e., the decoded result Rc3 is "1") and the LDPC decoded data $D_{LDPC3}$ as the decoded data Dc3. It means that the encoded data Ec3 is recovered to the raw data by the decoder 300.

When the determination unit 340 determines that the BCH decoded data $D_{BCH3}$ satisfies the null vector requirement (i.e., the BCH syndrome test data $S_{BCH3}$ is "1") and the LDPC decoded data fails to satisfy the null vector requirement (i.e., the LDPC syndrome test data $S_{LDPC3}$ is "0"), at Step S680, the determination unit 340 outputs the decoded result Rc3 indicating that the encoded data Ec3 has been decoded successfully (i.e., the decoded result Rc3 is "1") and the BCH decoded data $D_{BCH3}$ as the decoded data Dc3. It means that the encoded data Ec3 is recovered to the raw data by the decoder 300.

Conversely, when the determination unit 340 determines that the BCH decoded data $D_{BCH3}$ fails to satisfy the null vector requirement (i.e., the BCH syndrome test data $S_{BCH3}$ is "0") and the LDPC decoded data fails to satisfy the null vector requirement (i.e., the LDPC syndrome test data $S_{LDPC3}$ is "0"), the decoding method goes back to Step S620. At the present, the determination unit 340 outputs the operation signal Ca3 to the BCH decoder 330 and the LDPC decoder 320, such that the BCH decoder 330 decodes the updated encoded data Ec3 based on the BCH code to generate the next BCH syndrome test data $S_{BCH3}$ and the next BCH decoded data $D_{BCH3}$. The LDPC decoder 320 decodes the updated encoded data Ec3 based on the LDPC code to generate the next LDPC syndrome test data $S_{LDPC3}$ and the next LDPC decoded data $D_{LDPC3}$. Next, the determination unit 140 executes the next determination. It means that the decoder 300 still decodes the encoded data Ec3 to recover to the raw data at present.

When the determination unit 340 simultaneously determines that the number of times which the BCH decoded data $D_{BCH3}$ fails to satisfy the null vector requirement (i.e., the BCH syndrome test data is "0") and the LDPC decoded data $D_{LDPC3}$ fails to satisfy the null vector requirement (i.e., the LDPC syndrome test data is "0") is greater than a predefined erroneous number, the determination unit 340 outputs the decoded result Rc3 indicating that a failure has occurred for decoding the encoded data Ec3 (i.e., the decoded result Rc3 is "0") and the BCH decoded data $D_{BCH3}$ as the decoded data Dc3. It means that the decoder 300 is not capable of recovering the encoded data Ec3 to the raw data.

Figure 7:
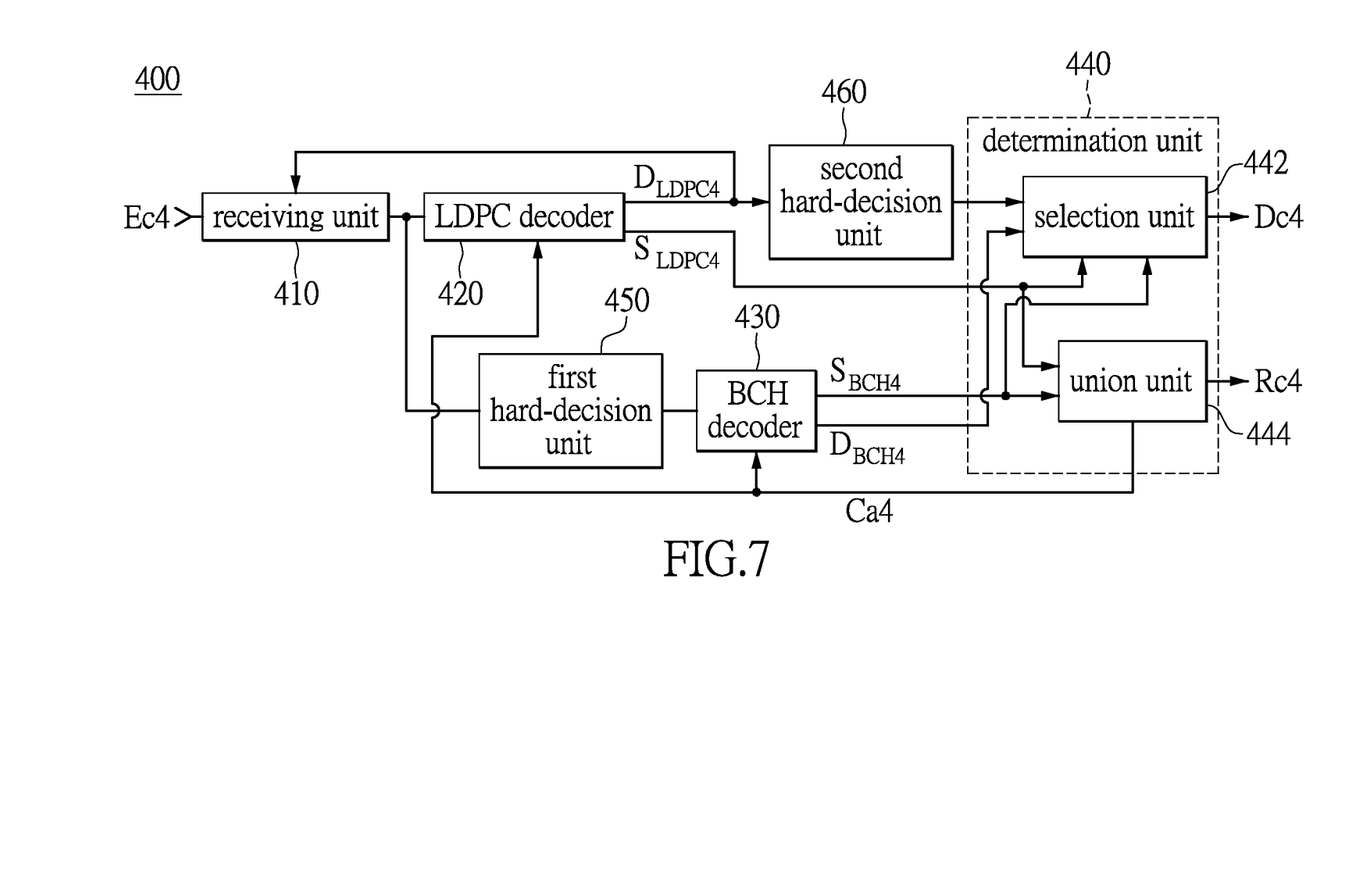
FIG. 7 shows a diagram of a decoder for a LDPC code and a BCH code provided according to another exemplary embodiment of the present disclosure.

Next, please refer to FIG. 7, which describes a diagram of a decoder for a LDPC code and a BCH code provided according to another exemplary embodiment of the present disclosure. The decoder 400 includes a receiving unit 410, a LDPC decoder 420, a BCH decoder 430, and a determination unit 440. The connective relationships and the operations of the receiving unit 410, the LDPC decoder 420, the BCH decoder 430, and the determination unit 440 of decoder 400 are same as those of the receiving unit 310, the LDPC decoder 320, the BCH decoder 330, and the determination unit 340 of decoder 300, and further descriptions are hereby omitted.

It is worth to note that the decoder 400 further includes a first hard-decision unit 450 and a second hard-decision unit 460. The first hard-decision unit 450 is coupled between the receiving unit 410 and the BCH decoder 430. The first hard-decision unit 450 performs a hard decision on the encoded data Ec4. The second hard-decision unit 460 is coupled between the LDPC decoder 420 and the determination unit 440. The second hard-decision unit 460 performs a hard decision on the LDPC decoded data $D_{LDPC4}$. In the present disclosure, the first hard-decision unit 450 and the second hard-decision unit 460 indicate the hard decision of error correction code. Thus, the hard decision result of the encoded data Ec4 is represented by a combination of a plurality of "0" and "1" and output to the BCH decoder 430. The hard decision result of LDPC decoded data $D_{LDPC4}$ is represented by a combination of a plurality of "0" and "1" and output to the determination unit 440.

In addition, the determination unit 440 includes a selection unit 442 and a union unit 444. The selection unit 442 is coupled to the LDPC decoder unit 420, the second hard-decision unit 460, and the BCH decoder 430. The selection unit 442 determines whether to output the LDPC decoded data $D_{LDPC4}$ in form of a plurality of "0" and "1" or to output the BCH decoded data $D_{BCH4}$ in form of a plurality of "0" and "1" according to the LDPC syndrome test data $S_{LDPC4}$ (i.e., the LDPC syndrome test data $S_{LDPC4}$ is "1" or "0") and the BCH syndrome test data $S_{BCH4}$ (i.e., the BCH syndrome test data $S_{BCH4}$ is "1" or "0"), such that the LDPC decoded data $D_{LDPC4}$ or the BCH decoded data $D_{BCH4}$ is output as the decoded data Dc4. Moreover, the union unit 444 is coupled to the LDPC decoder unit 420 and the BCH decoder 430. The union unit 444 outputs the decoded result Rc4 according to the LDPC syndrome test data $S_{LDPC4}$ (i.e., the LDPC syndrome test data $S_{LDPC4}$ is "1" or "0") and the BCH syndrome test data $S_{BCH4}$ (i.e., the BCH syndrome test data $S_{BCH4}$ is "1" or "0").

When the union unit 444 and the selection unit 442 receive the BCH decoded data $D_{BCH4}$ that satisfies the null vector requirement (i.e., the BCH syndrome test data $S_{BCH4}$ is "1") and the LDPC decoded data $D_{LDPC4}$ that satisfies the null vector requirement (i.e., the LDPC syndrome test data $S_{LDPC4}$ is "1"), the union unit 444 operatively outputs the decoded result Rc4 indicating that the encoded data Rc4 has been successfully decoded (i.e., the decoded result Rc4 is "1"), and the selection unit 442 outputs the LDPC decoded data $D_{LDPC4}$ as the decoded data Dc4 to inform the next-stage device (not shown in the drawings) that the encoded data Ec4 is recovered to the raw data.

When the union unit 444 and the selection unit 442 receive the BCH decoded data $D_{BCH4}$ that fails to satisfy the null vector requirement (i.e., the BCH syndrome test data $S_{BCH4}$ is "0") and the LDPC decoded data $D_{LDPC4}$ that satisfies the null vector requirement (i.e., the LDPC syndrome test data $S_{LDPC4}$ is "1"), the union unit 444 operatively outputs the decoded result Rc4 indicating that the encoded data Rc4 has been successfully decoded (i.e., the decoded result Rc4 is "1"), and the selection unit 442 outputs the LDPC decoded data $D_{LDPC4}$ as the decoded data Dc4 to inform the next-stage device (not shown in the drawings) that the encoded data Ec4 is recovered to the raw data.

When the union unit 444 and the selection unit 442 receive the BCH decoded data $D_{BCH4}$ that satisfies the null vector requirement (i.e., the BCH syndrome test data $S_{BCH4}$ is "1") and the LDPC decoded data $D_{LDPC4}$ that fails to satisfy the null vector requirement (i.e., the LDPC syndrome test data $S_{LDPC4}$ is "0"), the union unit 444 operatively outputs the decoded result Rc4 indicating that the encoded data Rc4 has been successfully decoded (i.e., the decoded result Rc4 is "1"), and the selection unit 442 outputs the BCH decoded data $D_{BCH4}$ as the decoded data Dc4 to inform the next-stage device (not shown in the drawings) that the encoded data Ec4 is recovered to the raw data.

Conversely, when the BCH decoded data $D_{BCH4}$ and the LDPC decoded data $D_{LDPC4}$ received by the union unit 444 and the selection unit 442 fail to satisfy the null vector requirement (i.e., the BCH syndrome test data $S_{BCH4}$ is "0"

and the LDPC syndrome test data $S_{LDPC4}$ is "0"), the union unit 444 does not output the decoded result Rc4, and the selection unit 442 does not output the decoded data Dc4, either. At present, the union unit 444 operatively outputs the operation signal Ca4 to the BCH decoder 430 and the LDPC decoder 420, such that the BCH decoder 430 decodes the updated encoded data Ec4 based on the BCH code to generate the next BCH syndrome test data $S_{BCH4}$ and the next BCH decoded data $D_{BCH4}$, and the LDPC decoder 420 decodes the updated encoded data Ec4 based on the LDPC code to generate the next LDPC syndrome test data $S_{LDPC4}$ and the next LDPC decoded data $D_{LDPC4}$.

When the union unit 444 and the selection unit 442 are indicated that the number of times of the BCH decoded data $D_{BCH4}$ fails to satisfy the null vector requirement (i.e., the BCH syndrome test data $S_{BCH4}$ is "0") and the LDPC decoded data $D_{LDPC4}$ fails to satisfy the null vector requirement (i.e., the LDPC syndrome test data $S_{LDPC4}$ is "0") is greater than a predefined erroneous number, the union unit 444 operatively outputs the decoded result Rc4 indicating a failure has occurred for decoding the encoded data Ec4 (i.e., the decoded result Rc4 is "0"), and the selection unit 442 outputs the BCH decoded data $D_{BCH4}$ as the decoded data Dc4 to inform the next-stage device (not shown in the drawings) that the encoded data Ec4 cannot be recovered to the raw data because of the encoded data Ec4 is lost or damaged.

In the present disclosure, the BCH syndrome test data $S_{BCH4}$ is not limited to be "0" or "1" to indicate whether the BCH decoded data $D_{BCH4}$ satisfies the null vector requirement. The LDPC syndrome test data $S_{LDPC4}$ is not limited to be "0" or "1" to indicate whether the LDPC decoded data $D_{LDPC4}$ satisfies the null vector requirement. The decoded result Rc4 is not limited to be "0" or "1" to indicate whether the encoded data Ec4 has been successfully decoded. They can also be presented in other representations, such as the signal "a" or "b", the probability (e.g., 90%), or the like. The present disclosure is not limited thereto.

In summary, the present disclosure provides a decoder for a LDPC code and a BCH code and a decoding method thereof, which can decode the encoded data based on the LDPC code and decode the encoded data based on the BCH code simultaneously, and output the decoded data after the decoding procedure has been finished. Additionally, in the decoding procedure for decoding the encoded data using the BCH code, the result of decoding the encoded data using the LDPC code is utilized, such that the speed for decoding the encoded data can be increased, and the overall decoding performance can be enhanced.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A decoding method applied for low density parity check (LDPC) code and Bose Chaudhuri Hocquenghem (BCH) code, used in a decoder for decoding encoded data using a bit node and a check node, the decoder comprising a receiving unit, a LDPC decoder, a BCH decoder, and a determination unit, the receiving unit coupled to the LDPC decoder and the BCH decoder, the BCH decoder coupled to the determination unit, and the decoding method comprising:

in the receiving unit, receiving the encoded data, and converting the bit node of the encoded data to meet the decoded algorithm of the LDPC code and the BCH code;

in the LDPC decoder, decoding the encoded data based on the LDPC code to generate LDPC syndrome test data and LDPC decoded data and updating the encoded data to generate LDPC decoded data as updated encoded data, wherein the LDPC syndrome test data is used to determine whether the LDPC decoded data satisfies a null vector requirement;

in the BCH decoder, in the process of decoding the encoded data based on the LDPC code, simultaneously decoding the encoded data based on the BCH code to generate a BCH syndrome test data and a BCH decoded data, wherein the BCH syndrome test data is used to determine whether the BCH decoded data satisfies the null vector requirement;

in the determination unit, when the BCH syndrome test data indicates that the BCH decoded data satisfies the null vector requirement and the LDPC syndrome test data indicates that the LDPC decoded data satisfies the null vector requirement, outputting a decoded result indicating that the encoded data has been successfully decoded and outputting the LDPC decoded data;

in the determination unit, when the BCH syndrome test data indicates that the BCH decoded data fails to satisfy the null vector requirement and the LDPC syndrome test data indicates that the LDPC decoded data satisfies the null vector requirement, outputting the decoded result indicating that the encoded data has been successfully decoded and outputting the LDPC decoded data;

in the determination unit, when the BCH syndrome test data indicates that the BCH decoded data satisfies the null vector requirement and the LDPC syndrome test data indicates that the LDPC decoded data fails to satisfy the null vector requirement, outputting a decoded result indicating that the encoded data has been successfully decoded and outputting the BCH decoded data; and in the determination unit, when the BCH syndrome test data indicates that the BCH decoded data fails to satisfy the null vector requirement and the LDPC syndrome test data indicates that the LDPC decoded data fails to satisfy the null vector requirement, decoding the updated encoded data based on the BCH code to generate a next BCH syndrome test data and a next BCH decoded data, and decoding the updated encoded data based on the LDPC code to generate a next LDPC syndrome test data and generate a next LDPC decoded data.

2. The decoding method according to claim 1, wherein before the encoded data is decoded based on the BCH code, the decoding method further comprises:

performing a hard decision on the encoded data such that the encoded data is represented by a combination of a plurality of "0" and "1" bits.

3. The decoding method according to claim 1, wherein when the BCH syndrome test data indicates that the number of times which the BCH decoded data fails to satisfy the null vector requirement is greater than a predefined erroneous number, outputting the decoded result indicating that a failure has occurred for decoding the encoded data and outputting the BCH decoded data.

4. The decoding method according to claim 1, wherein before the encoded data is decoded based on the BCH code, the decoding method further comprises:

performing a hard decision on the encoded data such that the encoded data is represented by a combination of a plurality of "0" and "1" bits.

5. The decoding method according to claim 1, wherein after the encoded data is decoded based on the LDPC code to generate the LDPC decoded data, the decoding method further comprises:
performing a hard decision on the LDPC decoded data such that the LDPC decoded data is represented by a combination of a plurality of "0" and "1" bits.

6. The decoding method according to claim 1, wherein when the number of times which the BCH decoded data fails to satisfy the null vector requirement and the number of times the LDPC decoded data fails to satisfy the null vector requirement is greater than the predefined erroneous number, outputting the decoded result indicating that a failure has occurred for decoding the encoded data and outputting the BCH decoded data.

7. A decoder for LDPC code and BCH code, configured to decode encoded data using a bit node and a check node, comprising:
a receiving unit, receiving the encoded data, and converting the bit node of the encoded data to meet the decoded algorithm of the LDPC code and the BCH code;
a LDPC decoder coupled to the receiving unit, operatively decoding the encoded data based on the LDPC code to generate LDPC syndrome test data and LDPC decoded data, wherein the LDPC decoder outputs the LDPC decoded data to the receiving unit for the receiving unit to update the encoded data to be the LDPC decoded data to generate updated encoded data, and the LDPC syndrome test data is used to determine whether the LDPC decoded data satisfies a null vector requirement;
a BCH decoder coupled to the receiving unit, and in the process of decoding the encoded data based on the LDPC code, simultaneously decoding the encoded data based on the BCH code to generate a BCH syndrome test data and a BCH decoded data, wherein the BCH syndrome test data is used to determine whether the BCH decoded data satisfies the null vector requirement; and
a determination unit coupled to the LDPC decoder and the BCH decoder;
wherein when the determination unit determines that the BCH decoded data satisfies the null vector requirement and the LDPC decoded data satisfies the null vector requirement, the determination unit outputs a decoded result indicating that the encoded data has been successfully decoded and outputs the LDPC decoded data;
wherein when the determination unit determines that the BCH decoded data fails to satisfy the null vector requirement and the LDPC decoded data satisfies the null vector requirement, the determination unit outputs the decoded result indicating that the encoded data has been successfully decoded and outputs the LDPC decoded data;
wherein when the determination unit receives the BCH decoded data that satisfy the null vector requirement and the LDPC decoded data that fails to satisfy the null vector requirement, the determination unit outputs a decoded result indicating that the encoded data has been successfully decoded and outputs the BCH decoded data;
wherein when the determination unit receives the BCH decoded data that fails to satisfy the null vector requirement and the LDPC decoded data that fails to satisfy the null vector requirement, the determination unit outputs an operation signal to the BCH decoder and the LDPC decoder, so as to drive the BCH decoder to decode the updated encoded data based on the BCH code and generate a next BCH syndrome test data and generate a next BCH decoded data, and to drive the LDPC decoder to decode the updated encoded data based on the LDPC code and generate a next LDPC syndrome test data and generate a next LDPC decoded data.

8. The decoder according to claim 7, further comprising a first hard-decision unit, wherein the first hard-decision unit is coupled between the receiving unit and the BCH decoder, and the first hard-decision unit performs a hard decision on the encoded data such that the encoded data is represented by a combination of a plurality of "0" and "1" bits.

9. The decoder according to claim 8, further comprising a second hard-decision unit, wherein the second hard-decision unit is coupled between the receiving unit and the LDPC decoder, and the second hard-decision unit performs a hard decision on the LDPC encoded data such that the LDPC encoded data is represented by a combination of a plurality of "0" and "1" bits.

10. The decoder according to claim 9, wherein the determination unit comprises:
a selection unit coupled to the LDPC decoder, the second hard-decision unit, and the BCH decoder, configured to operatively determine whether to output the LDPC decoded data in form of the plurality of "0" and "1" bits or to output the BCH decoded data in form of the plurality of "0" and "1" bits according to both the LDPC syndrome test data and the BCH syndrome test data; and
a union unit coupled to the LDPC decoder and the BCH decoder, configured to operatively output the decoded result according to both the LDPC syndrome test data and the BCH syndrome test data.

11. The decoder according to claim 10, wherein when the union unit and the selection unit receive the BCH decoded data that satisfies the null vector requirement and the LDPC decoded data that satisfies the null vector requirement, the union unit operatively outputs the decoded result indicating that the encoded data has been successfully decoded while the selection unit outputs the LDPC decoded data.

12. The decoder according to claim 10, wherein when the union unit and the selection unit receive the BCH decoded data that fails to satisfy the null vector requirement and the LDPC decoded data that satisfies the null vector requirement, the union unit operatively outputs the decoded result indicating that the encoded data has been successfully decoded while the selection unit outputs the LDPC decoded data.

13. The decoder according to claim 10, wherein when the union unit and the selection unit receive the BCH decoded data that satisfies the null vector requirement and the LDPC decoded data that fails to satisfy the null vector requirement, the union unit operatively outputs the decoded result indicating that the encoded data has been successfully decoded while the selection unit outputs the BCH decoded data.

14. The decoder according to claim 10, wherein when the union unit and the selection unit receive the BCH decoded data that fails to satisfy the null vector requirement and the LDPC decoded data that fails to satisfy the null vector requirement, the union unit operatively outputs the operation signal to the BCH decoder and the LDPC decoder, to cause the BCH decoder to decode the updated encoded data based on the BCH code to generate the next BCH syndrome test data and the next BCH decoded data, and cause the LDPC decoder to decode the updated encoded data based on the LDPC code to generate a next LDPC syndrome test data and generate a next LDPC decoded data.

15. The decoder according to claim 14, wherein when the number of times of the BCH decoded data fails to satisfy the null vector requirement and the LDPC decoded data fails to satisfy the null vector requirement are greater than a predefined erroneous number, the union unit operatively outputs the decoded result indicating a failure has occurred for decoding the encoded data while the selection unit outputs the BCH decoded data.

16. The decoder according to claim 7, wherein when the determination unit determines that the number of times which the BCH decoded data fails to satisfy the null vector requirement is greater than a predefined erroneous number, the determination unit outputs the decoded result indicating that a failure has occurred for decoding the encoded data and outputs the BCH decoded data.

17. The decoder according to claim 7, wherein when the determination unit determines that the number of times which the BCH decoded data fails to satisfy the null vector requirement and the LDPC decoded data fails to satisfy the null vector requirement is greater than a predefined erroneous number, the determination unit outputs the decoded result indicating that a failure has occurred for decoding the encoded data and outputs the BCH decoded data.

* * * * *